United States Patent [19]

Gorecki

[11] Patent Number: 4,492,972

[45] Date of Patent: Jan. 8, 1985

[54] JFET MONOLITHIC INTEGRATED CIRCUIT WITH INPUT BIAS CURRENT TEMPERATURE COMPENSATION

[75] Inventor: James L. Gorecki, Plymouth, Minn.

[73] Assignee: Honeywell Inc., Minneapolis, Minn.

[21] Appl. No.: 293,436

[22] Filed: Aug. 17, 1981

[51] Int. Cl.³ .................. H01L 29/48; H01L 29/06
[52] U.S. Cl. .................................. 357/22; 357/15; 357/20; 357/86
[58] Field of Search ............ 357/22 S, 22 R, 15 M, 357/15 R, 20, 86

[56] References Cited

U.S. PATENT DOCUMENTS

| | | | |
|---|---|---|---|
| 3,868,718 | 2/1975 | Arai | 357/22 |
| 3,971,055 | 7/1976 | Arai | 357/22 |
| 3,979,764 | 9/1976 | Arai | 357/22 |
| 4,068,254 | 1/1978 | Erdi | 357/36 |
| 4,143,386 | 3/1979 | Kaiser | 357/22 |
| 4,183,036 | 1/1980 | Müller | 357/15 |

FOREIGN PATENT DOCUMENTS

| | | | |
|---|---|---|---|
| 53-18390 | 2/1978 | Japan | 357/22 |
| 55-99761 | 7/1980 | Japan | 357/15 R |

Primary Examiner—Andrew J. James
Assistant Examiner—J. Carroll
Attorney, Agent, or Firm—Theodore F. Neils; David R. Fairbairn

[57] ABSTRACT

Temperature variation of the input bias current of a monolithic integrated circuit junction field-effect transistor (JFET) is provided by a compensation diode formed concurrently with the JFET in the monolithic integrated circuit. The compensation diode has a first region which is formed concurrently with the channel region of the JFET, and a second region which is formed concurrently with the gate region of the JFET. The areas of the first region and the channel region are equal. In addition, the area of the junction formed by the first and second regions of the compensating diode is equal to the area of the junction formed by the gate and channel regions of the JFET. The first region of the compensation diode is electrically connected to the gate region of the JFET so that reverse leakage current of the compensation diode compensates and tends to cancel the reverse leakage current of the gate-channel junction of the JFET.

27 Claims, 6 Drawing Figures

JFET MONOLITHIC INTEGRATED CIRCUIT WITH INPUT BIAS CURRENT TEMPERATURE COMPENSATION

BACKGROUND OF THE INVENTION

1. Field of the Invention

The present invention relates to junction field-effect transistors (JFETs). In particular, the present invention relates to an improved monolithic integrated circuit in which input bias current of the JFET is compensated.

2. Description of the Prior Art

Junction field-effect transistors have found increasing application in solid-state electronic circuits. One problem which is encountered with a JFET, however, is that the input bias current of the JFET can reach relatively high current levels (on the order of 1 microamp) at high temperature (greater than 100° C.). With a typical JFET, the input bias current doubles for approximately every 10° C. increase in temperature. This high input bias current at high temperature limits the use of a typical JFET for high input impedance amplifiers, if the amplifier is to be used at relatively high temperatures.

SUMMARY OF THE INVENTION

The present invention is an improved JFET monolithic integrated circuit which provides compensation for input bias current of a JFET over a range of temperatures. The present invention includes a JFET and a compensation device formed in a semiconductor integrated circuit. The JFET has a drain region of first conductivity type, a source region of first conductivity type, a channel region of first conductivity type extending between the drain region and the source region, and a gate region of second conductivity type adjacent the channel region to form a gate/channel junction. The compensation device has a first region of first conductivity type which is formed concurrently with the channel region of the JFET, and a second region of second conductivity type adjacent the first region which is formed concurrently with the gate region of the JFET. The first and second regions of the compensation device define a junction having an area with a predetermined relationship to the area of the gate/channel junction. The region of first conductivity type of the compensation device and the gate region of the JFET are electrically connected.

The input bias current of the JFET is created by the reverse leakage current $I_s$ of the junction formed by the gate region and channel region of the JFET. The compensation device has a reverse leakage current $I_c$. In the present invention, the compensation device and the JFET are electrically connected so that the leakage current $I_c$ of the compensation device tends to compensate and cancel the leakage current $I_s$ of the gate-channel junction of the JFET.

Leakage currents $I_s$ and $I_c$ are a function of junction area, temperature and band gap. The junction areas of the gate-channel junction and of the compensation device junction, therefore, are preferably approximately equal to one another. By making the junction areas approximately equal, and by forming the compensation device in the same semiconductor body concurrently with the formation of the JFET, leakage currents $I_s$ and $I_c$ match closely despite process variations during fabrication of the integrated circuit and temperature variations during operation of the integrated circuit.

DETAILED DESCRIPTION OF THE PREFERRED EMBODIMENTS

Figure 1:
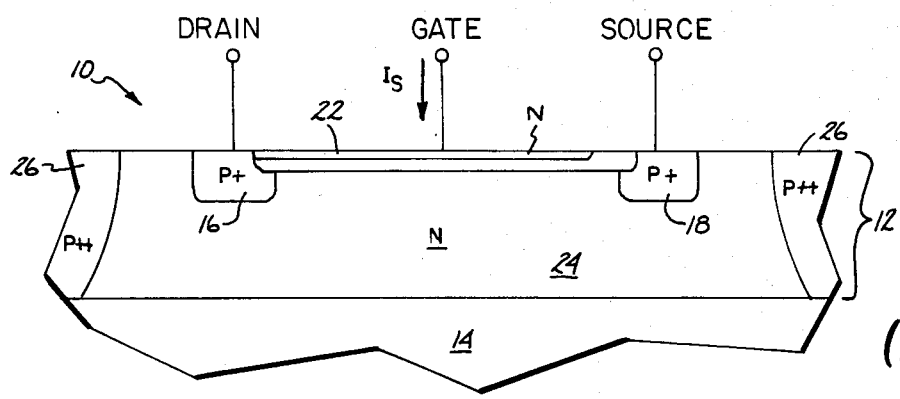
FIG. 1 is a sectional view of a typical integrated circuit JFET of the prior art.

FIG. 1 shows a prior art integrated circuit JFET 10. As shown in FIG. 10, JFET 10 is a P channel device formed in epitaxial layer 12, which is formed on substrate 14. Epitaxial layer 12 is initially N type conductivity, and substrate 14 is an intrinsic or P type semiconductor material, but may also be a crystalline insulator material such as sapphire or spinel. JFET 10 includes P+ type drain region 16, P+ type source region 18, P type channel 20, and N type gate region 22, all of which are formed in epitaxial layer 12. N type region 24 of layer 12 surrounds and underlies drain region 16, source region 18, channel 20, and gate region 22 to form a back gate for JFET 10. Gate region 22 and N type region 24 are preferably in physical contact and thus are electrically shorted together. JFET 10 is electrically isolated from other devices which are formed in epitaxial layer 12 by P++ type isolation region 26.

In the embodiment of JFET 10 shown in FIG. 1, drain and source regions 16 and 18 are typically formed by diffusion of acceptor impurities into N type epitaxial layer 12. P type channel region 20, which extends between drain and source regions 16 and 18, is formed by ion implantation of acceptor ions, such as boron. N type gate region 22 is a shallow region which overlies channel region 20, and is formed by a subsequent ion implantation step in which donor ions (e.g. arsenic) are implanted. JFET 10 exhibits an input bias current, which is a result of the reverse leakage current $I_s$ of the diode formed by gate 22 and N region 24 and channel 20.

$$I_s \propto A_1 T^3 (e^{-Eg/KT}) \qquad \text{Equation 1}$$

where
$A_1$ = junction area of the gate-channel diode
T = absolute temperature
Eg = energy gap
K = Boltzmann constant.

At high temperatures (greater than 100° C.), the input bias current may reach large current levels (approximately 1,000 times greater than the value of the bias current at 25° C.). This temperature dependence of the input bias current is due to the temperature dependence of reverse leakage current $I_s$, as shown in Equation 1.

In the past, arsenic has been found to be a particularly advantageous donor ion for use in forming gate region 22, since it will form a very shallow N type region at reasonable implant voltages. The arsenic ion is, however, rather large and appears to aggravate the leakage current problem. It is believed that the arsenic ions disturb the surface of epitaxial layer 12 to a greater extent than other smaller ions, and that this is the cause of the greater leakage current exhibited.

For many applications, a high input impedance amplifier is required. The high input bias current (on the order of 1 microamp) at high temperature precludes the use of JFET 10 in these applications, if high temperature operation is required.

FIGS. 2-6 show a preferred embodiment of the present invention in which the temperature dependance of leakage current $I_s$ of a JFET is compensated. The monolithic integrated circuit of the present invention, as shown in FIGS. 2-5 (and as illustrated schematically in FIG. 6), includes P channel JFET 30 and compensation diode 32, which are formed in a common monolithic semiconductor integrated circuit 34. In particular, both JFET 30 and compensation diode 32 are formed in epitaxial layer 36, which overlies substrate 38 and which is initially N type conductivity. Substrate 38 is preferably an intrinsic or P type semiconductor material or a crystalline insulator material.

Figure 2:
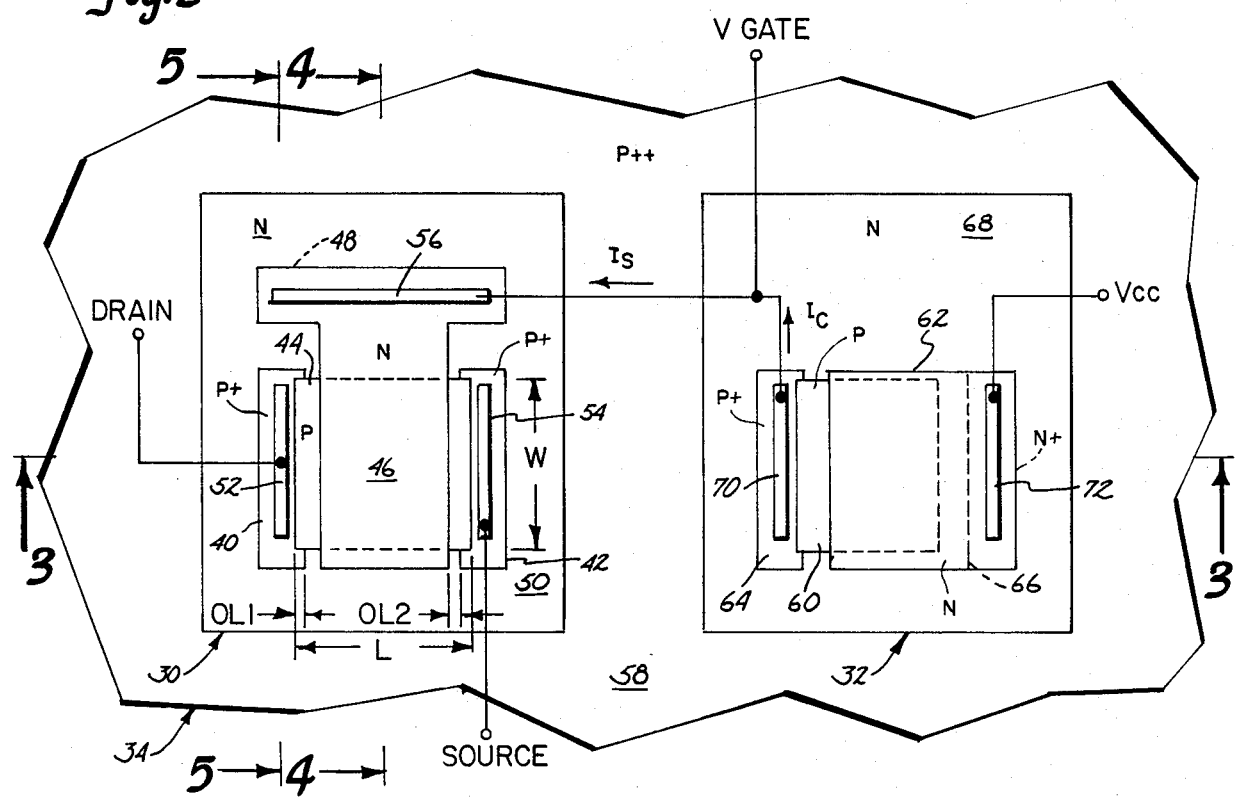
FIG. 2A is a top view, showing a preferred embodiment of the input bias current compensated monolithic JFET circuit of the present invention, which includes a JFET and a compensation diode.
Figure 3:
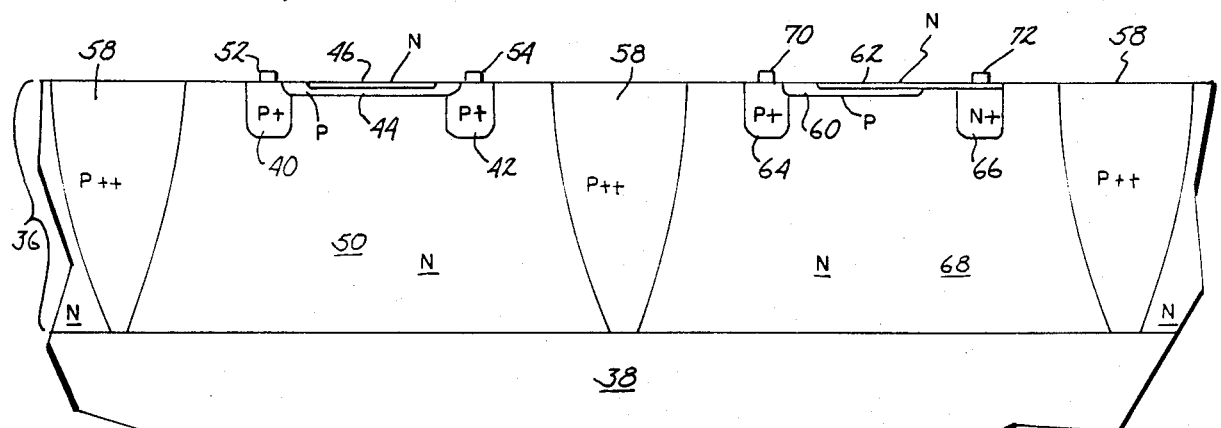
FIG. 3 is a sectional view of the JFET and compensation diode along section 3—3 of FIG. 2.
Figure 4:
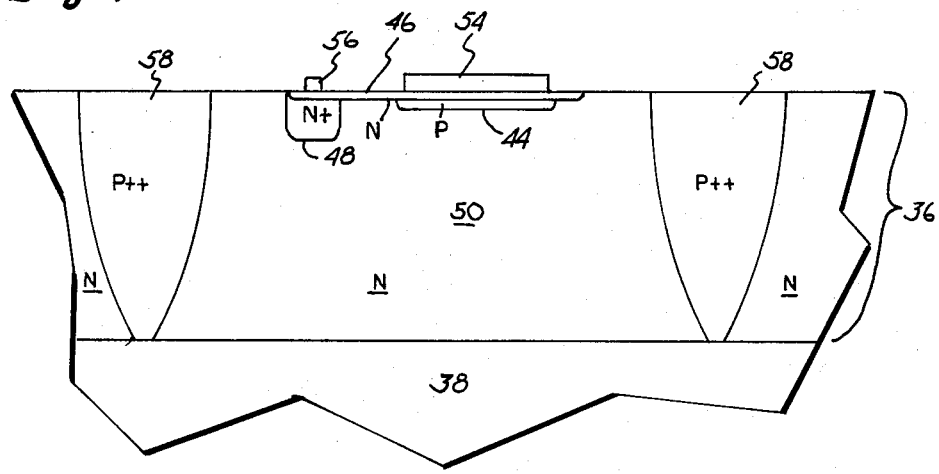
FIG. 4 is a sectional view of the JFET along section 4—4 of FIG. 2.
Figure 5:
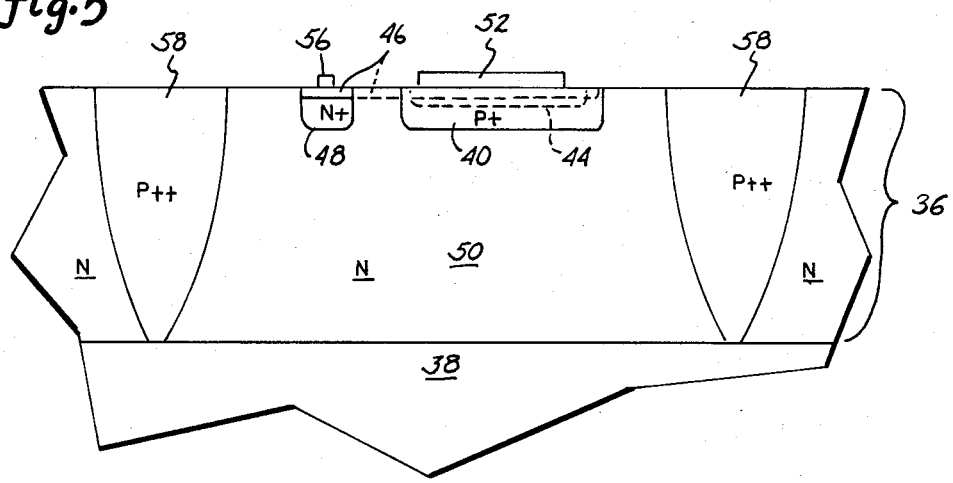
FIG. 5 is a sectional view of the JFET along section 5—5 of FIG. 2.

JFET 30 includes diffused P+ type drain region 40, diffused P+ type source region 42, ion implanted P type channel 44, ion implanted N type gate region 46, diffused N+ type gate contact region 48, and N type region 50. As shown in FIG. 2, N type gate region 46 and N type region 50 are in physical contact and thus are electrically shorted together. N type region 50, therefore, forms the back gate of JFET 30. Electrical connections to drain region 40, source region 42, and gate region 46 are made by means of drain contact 52, source contact 54, and gate contact 56, respectively. JFET 30 is isolated from other semiconductor devices in epitaxial layer 36 by P++ type isolation region 58.

As shown in FIGS. 2-5, P type channel 44 has a width W which is greater than its length L. In a typical JFET made in accordance with the present invention, W is approximately 3 mils, and L is approximately 1 mil. P type channel region 44 partially overlaps drain region 40 and P+ type source region 42 to make electrical contact with regions 40 and 42. In FIG. 2 this overlap is designated as OL1, and in a preferred embodiment is on the order of 0.2 mil.

N type gate region 46 does not overlap P+ type drain and source regions 40 and 42, but does overlap, of course, P type channel region 44. By separating N type gate region 46 from drain and source regions 40 and 42, low breakdown voltages between gate region 46 and either drain region 40 or source region 42 are avoided. In the preferred embodiment shown in FIGS. 2-5, the space between gate region 46 and drain region 40, and the space between gate region 46 and source region 42, are each designated OL2. Space OL2 is, in the example discussed above, preferably about 0.2 mil.

Compensation diode 32 includes P type region 60, which is formed by ion implantation at the same time as P type channel region 44 of JFET 30. Diode 32 also includes N type region 62, which is formed concurrently with N type gate region 46 of JFET 30 by ion implantation. P type region 60 contacts and extends from diffused P+ type region 64, which is formed concurrently with diffused P+ type drain and source regions 40 and 42 of JFET 30. Similarly, N type region 62 contacts and extends from diffused N+ type region 66, which is formed concurrently with diffused N+ type gate contact region 48 of JFET 30. Diode 32 further includes N type region 68, which underlies and surrounds regions 60, 62, 64 and 66. Electrical connections to regions 64 and 66 are made by contacts 70 and 72, respectively. Compensation diode 32 is also separated from other electrical devices in epitaxial layer 36 by P++ type isolation region 58.

Figure 6:
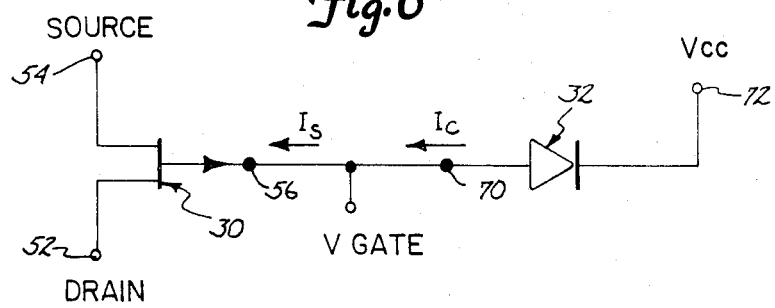
FIG. 6 is an electrical schematic diagram of the embodiment of the present invention shown in FIG. 2.

As illustrated in FIGS. 2 and 6, contact 70 of compensation diode 32 is connected to contact 56 of JFET 30 so that reverse leakage current $I_c$ of the junction formed by P type region 60 and N type region 62 of compensation diode 32 tends to cancel the leakage current $I_s$ of JFET 30.

$$I_c \propto A_2 T^3 (e^{-Eg/KT}) \qquad \text{Equation 2}$$

where
 $A_2$ = Junction area of diode 32
 T = absolute temperature
 Eg = energy gap
 k = Boltzmann constant.

Contact 72 of compensation diode 32 is connected to a positive supply voltage $V_{cc}$ which is greater than the largest value of input gate voltage ($V_{GATE}$) expected to be applied to gate contact 56 of JFET 30 (and thus to contact 70 of diode 32), so that compensation diode 32 remains reverse-biased at all times.

As illustrated in FIGS. 2-5, the junction area $A_2$ of compensation diode 32 and the junction area $A_1$ of the diode formed by gate 46 and N type region 50 and channel 44 of JFET 30 are made to be approximately equal. This eliminates area mismatch which could otherwise result in differences in the values of $I_s$ and $I_c$. As shown in Equations 1 and 2, $I_s$ and $I_c$ are a function of the junction area of their respective diodes.

To achieve approximately equal junction areas, the length and width of P type region 60 of compensation diode 32 are preferably identical to the length L and width W of P type channel 44 of JFET 30. In addition, the area of intersection of N type gate 46 and P type channel 44 is preferably equal to the area of intersection of N type region 62 and P type region 60 of diode 32. The overlap length of P type region 60 and P+ type region 64 of compensation diode 32 is preferably equal to OL1, the overlap length of P type channel 44 and P+ type drain region 40 of JFET 30. Finally, the area of N type regions 50 and 68 are equal in this particular embodiment. In the embodiment shown in FIGS. 2-5, compensation diode 32 has only one P+ region 64, while JFET 30 has two P+ regions (drain region 40 and source region 42). In the embodiment illustrated in FIG. 2, therefore, there is a slight junction area mismatch. It has been found, however, that the most critical area as far as JFET leakage current is concerned are (1) the area of the junction between P type channel region 44 and N type gate region 46, and (2) the area of the junction between P type channel region 44 and N type epitaxial region 50. Compensation diode 32 illustrated in FIG. 2 matches these two critical junction areas by having the area of the junction between P type region 60 and N type region 62 match the junction between P type channel region 44 and N type gate region 46, and by having the junction between P type region 60 and N type epitaxial region 68 match the area of the junction between P type channel region 44 and N type epitaxial region 50.

If it is desired to exactly match the total junction areas of the JFET 30 and the compensation diode 32, this can be achieved by making the area of P+ diffused region 64 of compensation diode 32 equal to the sum of the areas of P+ drain region 40 and P+ source region 42 of JFET 30.

In another embodiment of the present invention, an exact match in junction area can be achieved by forming compensation diode 32 with identical structure to JFET 30. In this embodiment, the source and drain regions of the compensation diode are connected together, and then connected to the gate of JFET 30. The gate of the compensation diode is connected to a supply voltage $V_{cc}$.

One advantage of using a diode structure for compensation diode 32 is that the total area occupied by compensation diode 32 can, in some cases, be considerably smaller than the area of the integrated circuit chip occupied by JFET 30. This is particularly the case where JFET 30 has an interdigitated structure. The structure of compensation diode 32 can, on the other hand, be simpler, since it does not have to be interdigitated, and thus will occupy considerably smaller area on the integrated circuit chip.

Because the same implantation steps are used to form N type gate 46 and N type region 62 and to form P type channel 44 and P type region 60, the same diffusion steps are used to form P+ drain and source regions 40 and 42 and P+ region 64, and the same diffusion steps are used to form N+ gate contact region 48 and N+ region 66, any doping variations in the fabrication process will be present in both JFET 30 and compensation diode 32, and thus in their effect on $I_s$ and $I_c$, will tend to cancel.

In theory, the values of $I_s$ and $I_c$ are independent of voltage. In actual practice, however, there is a slight voltage dependence of these reverse-bias leakage currents. As a result, as the value of $V_{GATE}$ varies, some small variations in the values of $I_s$ and $I_c$ will occur. Despite these variations due to voltage, however, compensation diode 32 is still highly effective in cancelling the temperature dependence of the input bias current of JFET 30.

In conclusion, the present invention provides compensation of the input bias current of integrated circuit JFETs, thus permitting JFETs to be used over wide temperature ranges, even where high input impedance is required. By use of a compensation diode which is formed with the same implantation steps as the gate and channel regions of the JFET, the JFET leakage current and the compensation current match very closely with process and temperature variations.

Still another important advantage is that the structure of the JFET itself is not changed. Thus other desirable characteristics of the JFET are not sacrificed while providing input bias current compensation. In addition, no additional process steps are required.

Although the present invention has been described with reference to preferred embodiments, workers skilled in the art will recognize that changes may be made in form and detail without departing from the spirit and scope of the invention.

What is claimed is:

1. A gate-channel reverse leakage current compensated junction field effect transistor (JFET) monolithic integrated circuit comprising:
   a JFET having a drain region of first conductivity type, a source region of first conductivity type, a channel region of first conductivity type extending between the drain region and the source region, and a first gate region of second conductivity type adjacent the channel region, the first gate region and the channel region defining a first gate/channel junction of a first junction area which junction exibits a reverse leakage current;
   a compensation device having a first region of first conductivity type formed concurrently with the channel region of the JFET and a second region of second conductivity type adjacent the region of first conductivity type and formed concurrently with the first gate region of the JFET, the first and second regions of the compensation device defining a first compensation junction of a second junction area which junction exhibits a reverse leakage current, the first junction area having a predetermined relationship with the second junction area; and
   means for electrically connecting the first region of first conductivity type of the compensation device and the first gate region of the JFET so that the reverse leakage current of the compensation device tends to compensate the reverse leakage current of the JFET.

2. The invention of claim 1 wherein the first and second areas are approximately equal.

3. The invention of claim 1 and further comprising:
   means for applying a potential to the compensation device to maintain the compensation device in a reverse biased condition.

4. The invention of claim 1 wherein the JFET and the compensation device are formed in an epitaxial layer of semiconductor material of second conductivity type.

5. The invention of claim 4 and further comprising:
   isolation means for isolating a portion of the epitaxial layer in which the JFET is formed from a portion of the epitaxial layer in which the compensation device is formed.

6. The invention of claim 1 wherein the channel region of the JFET and the first region of the compensation device are formed concurrently by ion implantation; wherein the first gate region of the JFET and the second region of the compensation device are formed concurrently by ion implantation; wherein the first gate region at least partially overlies the channel region; and wherein the second region of the compensation device at least partially overlies the first region of the compensation device.

7. The invention of claim 6 wherein the compensation device further comprises a diffused region of first conductivity type in contact with the first region of first conductivity type and formed concurrently with the also diffused drain and source regions of the JFET.

8. The invention of claim 7 wherein the JFET further comprises a diffused gate contact region of second conductivity type in contact with the gate region, and the compensation device further comprises a diffused region of second conductivity type in contact with the second region of second conductivity type and formed concurrently with the diffused gate contact region of the JFET.

9. The invention of claim 8 wherein the means for electrically connecting the first region of first conductivity type of the compensation device and the first gate region of the JFET electrically connects the diffused region of first conductivity type of the compensation device and the diffused gate contact region of the JFET.

10. The invention of claim 9 and further comprising:

means for connecting the diffused gate contact region of the JFET to receive a gate voltage; and means for connecting the diffused region of the second type conductivity type compensation device to a supply voltage to maintain the compensation device reverse biased over a range of values of the gate voltage.

11. The invention of claim 6 wherein the JFET further comprises a second gate region of second conductivity type underlying the channel region to form a second gate/channel junction which exhibits a reverse leakage current, and wherein the compensation device further comprises a third region of second conductivity type underlying the first region to form a second compensation junction which exhibits a reverse leakage current, and wherein the JFET and the compensation device are electrically connected so that the reverse leakage current of the second compensation junction tends to compensate the reverse leakage current of second gate/channel junction of the JFET.

12. The invention of claim 11 wherein the first and second gate regions of the JFET are electrically connected, and the second and third regions of the compensation device are electrically connected.

13. The invention of claim 1 wherein the first conductivity type is P type, and in which the second conductivity type is N type.

14. A semiconductor device comprising:

a body of semiconductor material;

a JFET formed in the body and having a channel region of first conductivity type and a first gate region of second conductivity type adjacent the channel region, the first gate region and the channel region defining a first gate/channel junction of a first junction area which junction exhibits a reverse leakage current;

a compensation device formed in the body and having a first region of first conductivity type formed concurrently with the channel region of the JFET and a second region of second conductivity type adjacent the first region of first conductivity type and formed concurrently with the first gate region of the JFET, the first and second regions of the compensation device defining a first compensation junction of a second junction area which junction exhibits a reverse leakage current, the first junction area having a predetermined relationship with the second junction area; and means for electrically connecting the compensation device and the JFET so that the reverse leakage current of the compensation device supplies at least part of and tends to compensate the reverse leakage current of the JFET.

15. The invention of claim 14 wherein the first and second areas are approximately equal.

16. The invention of claim 14 and further comprising:
means for applying a potential to the compensation device to maintain the compensation device in a reverse biased condition.

17. The invention of claim 14 wherein the body of semiconductor material includes an epitaxial layer, and wherein the JFET and the compensation device are formed in the epitaxial layer.

18. The invention of claim 17 wherein the epitaxial layer is of second conductivity type.

19. The invention of claim 18 and further comprising:
isolation means for isolating a portion of the epitaxial layer in which the JFET is formed from a portion of the epitaxial layer in which the compensation device is formed.

20. The invention of claim 14 wherein the channel region of the JFET and the first region of the compensation device are formed concurrently by ion implantation; wherein the first gate region of the JFET and the second region of the compensation device are formed concurrently by ion implantation; wherein the first gate region at least partially overlies the channel region; and wherein the second region of the compensation device at least partially overlies the first region of the compensation device.

21. The invention of claim 20 wherein the compensation device further comprises a diffused region of first conductivity type in contact with the first region of first conductivity type and formed concurrently with the also diffused drain and source regions of the JFET.

22. The invention of claim 21 wherein the JFET further comprises a diffused gate contact region of second conductivity type in contact with the gate region and the compensation device further comprises a diffused region of second conductivity in contact with the second region of second conductivity type and formed concurrently with the diffused gate contact region of the JFET.

23. The invention of claim 22 wherein the means for electrically connecting the first region of first conductivity type of the compensation device and the first gate region of the JFET electrically connects the diffused region of first conductivity type of the compensation device and the diffused gate contact region of the JFET.

24. The invention of claim 23 and further comprising:
means for connecting the diffused gate contact region of the JFET to receive a gate voltage; and means for connecting the diffused region of second conductivity type of the compensation device to a supply voltage to maintain the compensation device reverse biased over a range of values of the gate voltage.

25. The invention of claim 20 wherein the JFET further comprises a second gate region of second conductivity type underlying the channel region to form a second gate/channel junction which exhibits a reverse leakage current, and wherein the compensation device further comprises a third region of second conductivity type underlying the first region to form a second compensation junction which exhibits a reverse leakage current and wherein the JFET and the compensation device are electrically connected so that the reverse leakage current of the second compensation junction tends to compensate the reverse leakage current of second gate/channel junction of the JFET.

26. The invention of claim 25 wherein the first and second gate regions of the JFET are electrically connected and the second and third regions of the compensation device are electrically connected.

27. A semiconductor device comprising:

a substrate;

an epitaxial layer of semiconductor materials of initially a second conductivity type on the substrate;

a JFET formed in the epitaxial layer and having a channel region of first conductivity type and a gate region of second conductivity type adjacent the channel region, the gate region and the channel region defining a gate/channel junction of a first junction area which junction exhibits a reverse leakage current;

a compensation device formed in the epitaxial layer as a diode in having a first region of first conductivity type formed concurrently with the channel region of the JFET and a second region of second conductivity type adjacent the first region of first conductivity type and formed concurrently with the gate region of the JFET, the first and second regions of the diode defining a compensation junction of a second junction area which junction exhibits a reverse leakage current, the first junction area having a predetermined relationship with the second junction area; and means for electrically connecting the compensation device and the JFET so that the reverse leakage current of the compensation device supplies at least part of and tends to compensate the reverse leakage current of the JFET.

* * * * *